US009761968B1

(12) United States Patent
Fan et al.

(10) Patent No.: US 9,761,968 B1

(45) Date of Patent: Sep. 12, 2017

(54) ELECTRONIC DEVICE PACKAGE BOX

(71) Applicant: BOTHHAND ENTERPRISE INC., Tainan (TW)

(72) Inventors: Chung-Cheng Fan, Taoyuan (TW); Yung-Ming Pan, Taoyuan (TW)

(73) Assignee: BOTHHAND ENTERPRISE INC., Tainan (TW)

( * ) Notice: Subject to any disclaimer, the term of this patent is extended or adjusted under 35 U.S.C. 154(b) by 0 days.

(21) Appl. No.: 15/198,340

(22) Filed: Jun. 30, 2016

(30) Foreign Application Priority Data

Mar. 8, 2016 (TW) ............................ 105107071 A

(51) Int. Cl.

*H05K 7/02* (2006.01)
*H05K 7/04* (2006.01)
*H01R 12/57* (2011.01)

(52) U.S. Cl.

CPC .................................... *H01R 12/57* (2013.01)

(58) Field of Classification Search

CPC . H01R 12/57; H01R 9/22; H05K 7/02; H05K 5/03

USPC .......................................... 361/807, 809–810

See application file for complete search history.

(56) References Cited

U.S. PATENT DOCUMENTS

| | | | | |
|---|---|---|---|---|
| 6,946,942 | B1 * | 9/2005 | Chih-Min | H01F 19/00 336/105 |
| 7,517,254 | B2 * | 4/2009 | Zhang | H01R 13/6658 439/541.5 |
| 8,339,806 | B2 * | 12/2012 | Cheng | H05K 9/0066 361/730 |
| 8,403,701 | B2 * | 3/2013 | Han | H01R 13/6594 439/541.5 |
| 2011/0095847 | A1 * | 4/2011 | Chen | H01F 17/062 333/175 |
| 2013/0178104 | A1 * | 7/2013 | Lin | H01R 9/22 439/626 |
| 2016/0183400 | A1 * | 6/2016 | Pan | H01F 27/04 361/752 |

* cited by examiner

*Primary Examiner* — Hung S Bui

(74) *Attorney, Agent, or Firm* — Kirton McConkie; Evan R. Witt

(57) ABSTRACT

An electronic device package box includes a box unit having lower and upper end sections that are spaced apart in an up-down direction, and multiple first and second connecting pins that are aligned with each other and alternatingly arranged in a longitudinal direction perpendicular to the up-down direction. Each first connecting pin has a first embedded portion, a first wire-connecting portion extending from the lower end section, and a first extending portion extending from the box unit and proximate to the lower end section. Each second connecting pin has a second embedded portion, a second wire-connecting portion extending from the upper end section, and a second extending portion extending from the box unit and proximate to the lower end section.

3 Claims, 4 Drawing Sheets

ELECTRONIC DEVICE PACKAGE BOX

CROSS-REFERENCE TO RELATED APPLICATION

This application claims priority of Taiwanese Patent Application No. 105107071, filed on Mar. 8, 2016.

FIELD

The disclosure relates to an electronic device package box, and more particular to a surface mount electronic device package box.

BACKGROUND

Conventionally, there are two major technologies for mounting an electronic device package box to a circuit board. The two major technologies are through-hole technology and surface-mount technology.

FIG. 1 illustrates a conventional electronic device package box 1 used in the surface-mount technology, in which the conventional electronic device package box 1 is typically called a surface-mount device (SMD). The conventional electronic device package box 1 includes a box body 11 and a plurality of connecting pins 12 mounted to the box body 11. The conventional electronic device package box 1 can be mounted to a circuit board 21 by, for example, welding the connecting pins 12 to the circuit board 21. A plurality of coil components 22 can be mounted to the box body 11, and be electrically connected to the connecting pins 12.

Compared to the through-hole technology, the use of surface-mount technology avoids the necessity of drilling holes in the circuit board 21. In addition, the surface-mount technology provides smaller package element size. However, in order to leave ample rooms for electrical connection between the coil components 22 and the connecting pins 12, the connecting pins 12 must be sufficiently spaced apart from each other, which leads to a larger overall size of the conventional electronic device package box 1. Another solution is to add an additional box unit (not shown) to provide more connecting pins for electrically connection to the coil components 22. Nonetheless, the additional box unit also attributes to larger overall size. With the growing demands for electronic device miniaturization, the larger size associated with the conventional electronic device package box 1 is undesirable.

SUMMARY

Therefore, an object of the present disclosure is to provide an electronic device package box that can alleviate at least one of the drawbacks associated with the prior art.

According to the present disclosure, the electronic device package box is adapted to be electrically connected to a plurality of coil components. The electronic device package box includes a box unit, and at least one pin row including a plurality of first connecting pins and a plurality of second connecting pins. The box unit defines a lower space and an upper space that are opposite to each other in an up-down direction and that respectively receive corresponding ones of the coil components therein, and includes a separating wall, a lower end section and an upper end section. The separating wall separates the lower space and the upper space from each other. The lower end section and the upper end section are spaced apart from each other in the up-down direction.

The first connecting pins are mounted to the box unit. Each of the first connecting pins has a first embedded portion, a first wire-connecting portion and a first extending portion.

The second connecting pins are mounted to the box unit. Each of the second connecting pins has a second embedded portion, a second wire-connecting portion and a second extending portion.

The first connecting pins and the second connecting pins are spaced apart from each other, and are aligned with each other and alternatingly arranged in a longitudinal direction perpendicular to the up-down direction.

In each of the first connecting pins, the first embedded portion is embedded in the box unit, the first wire-connecting portion is connected to the first embedded portion and extends from the lower end section of the box unit so as to connect with a corresponding one of the coil components received in the lower space, and the first extending portion is connected to the first embedded portion, extends from the box unit and is proximate to the lower end section.

In each of the second connecting pins, the second embedded portion is embedded in the box unit, the second wire-connecting portion is connected to the second embedded portion and extends from the upper end section of the box unit so as to connect with a corresponding one of the coil components received in the upper space, and the second extending portion is connected to the second embedded portion, extends from the box unit and is proximate to the lower end section.

BRIEF DESCRIPTION OF THE DRAWINGS

Other features and advantages of the present disclosure will become apparent in the following detailed description of the embodiment with reference to the accompanying drawing, of which.

DETAILED DESCRIPTION

Figure 1:
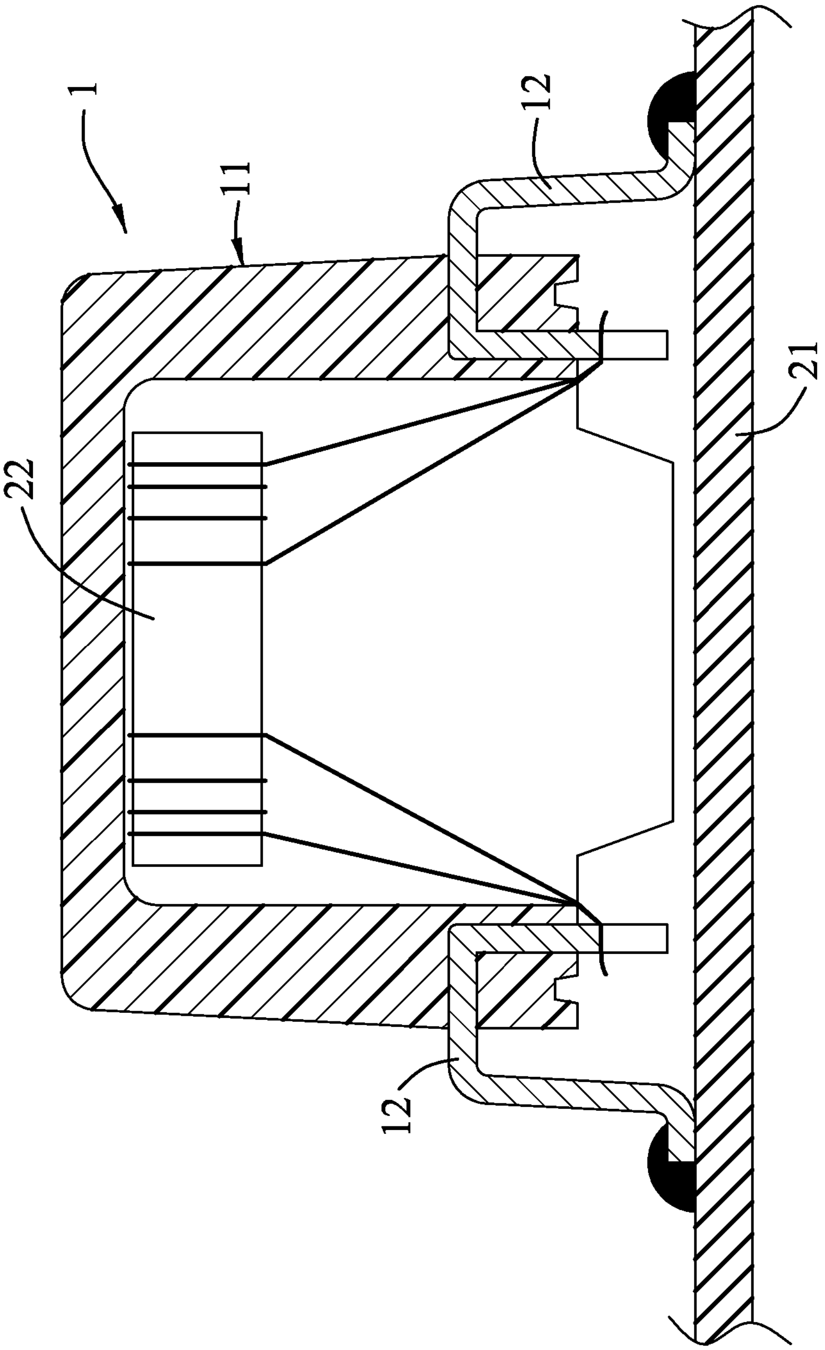
FIG.1 PRIOR ART
FIG. 1 is a partly sectional view of a conventional electronic device package box that is mounted to a circuit board.
Figure 2:
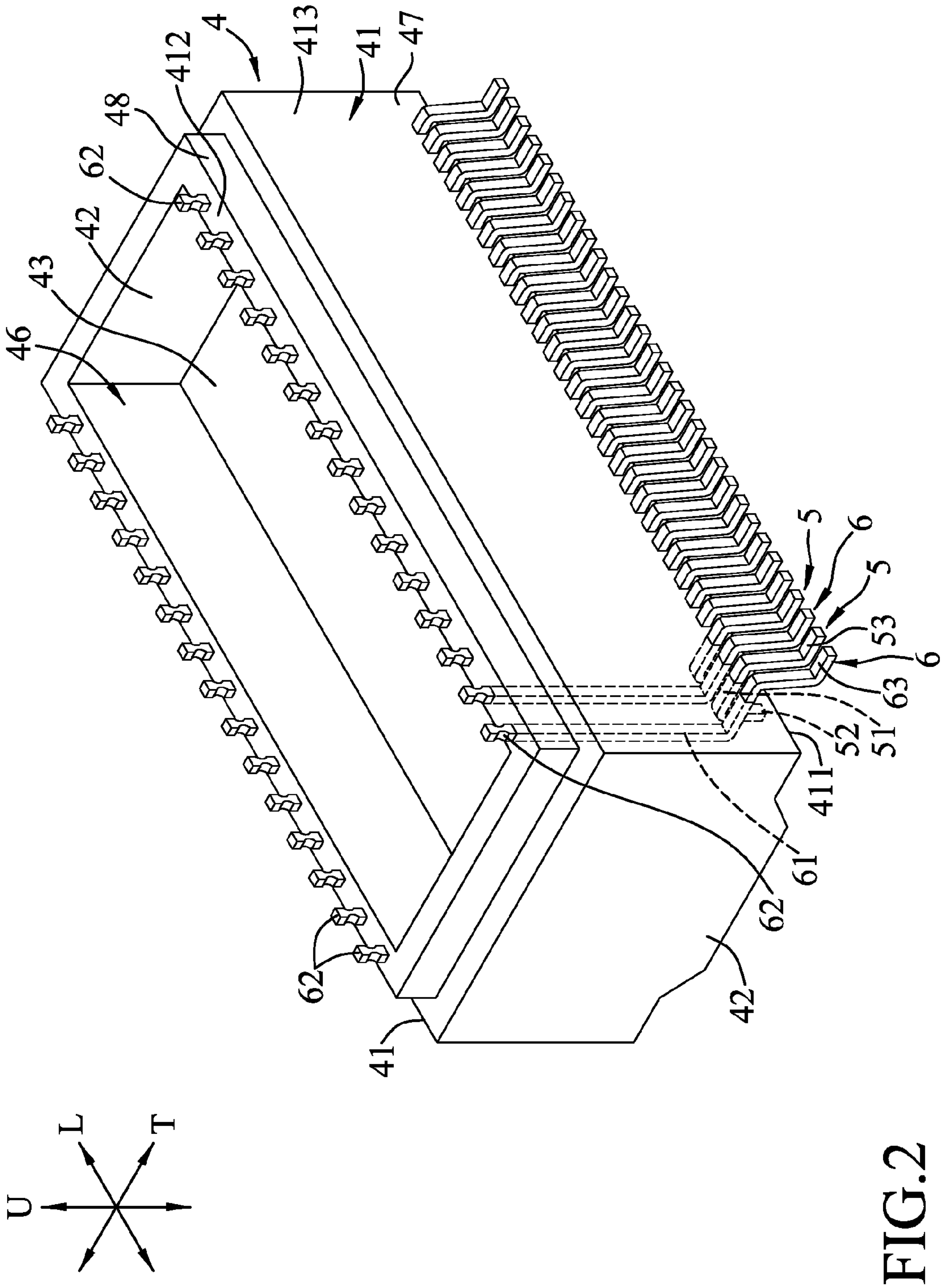
FIG. 2 is a perspective view of an embodiment of an electronic device package box according to this disclosure.
Figure 3:
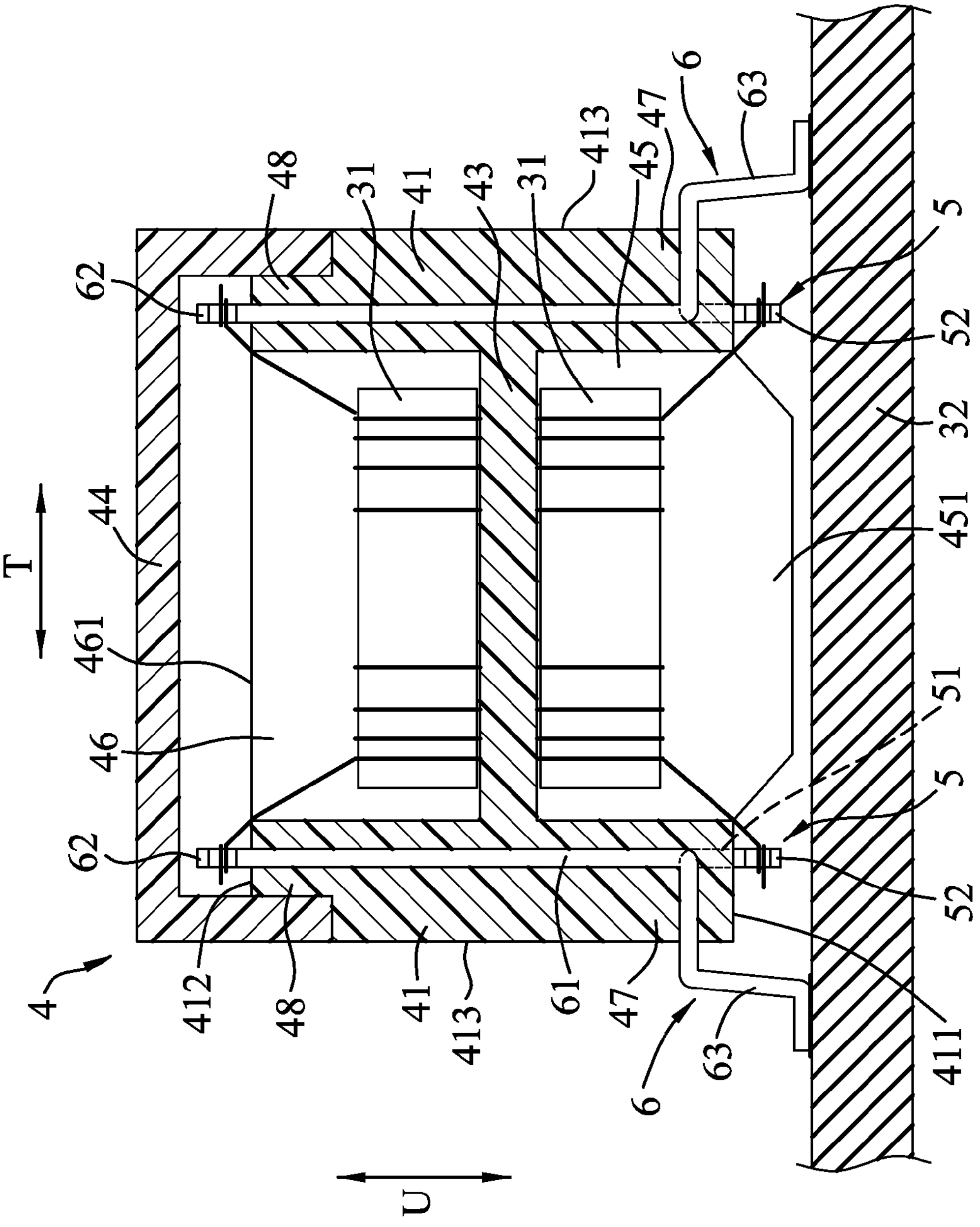
FIG. 3 is a partly sectional view of the embodiment that is electrically connected to a plurality of coil components and that is mounted to a circuit board.
Figure 4:
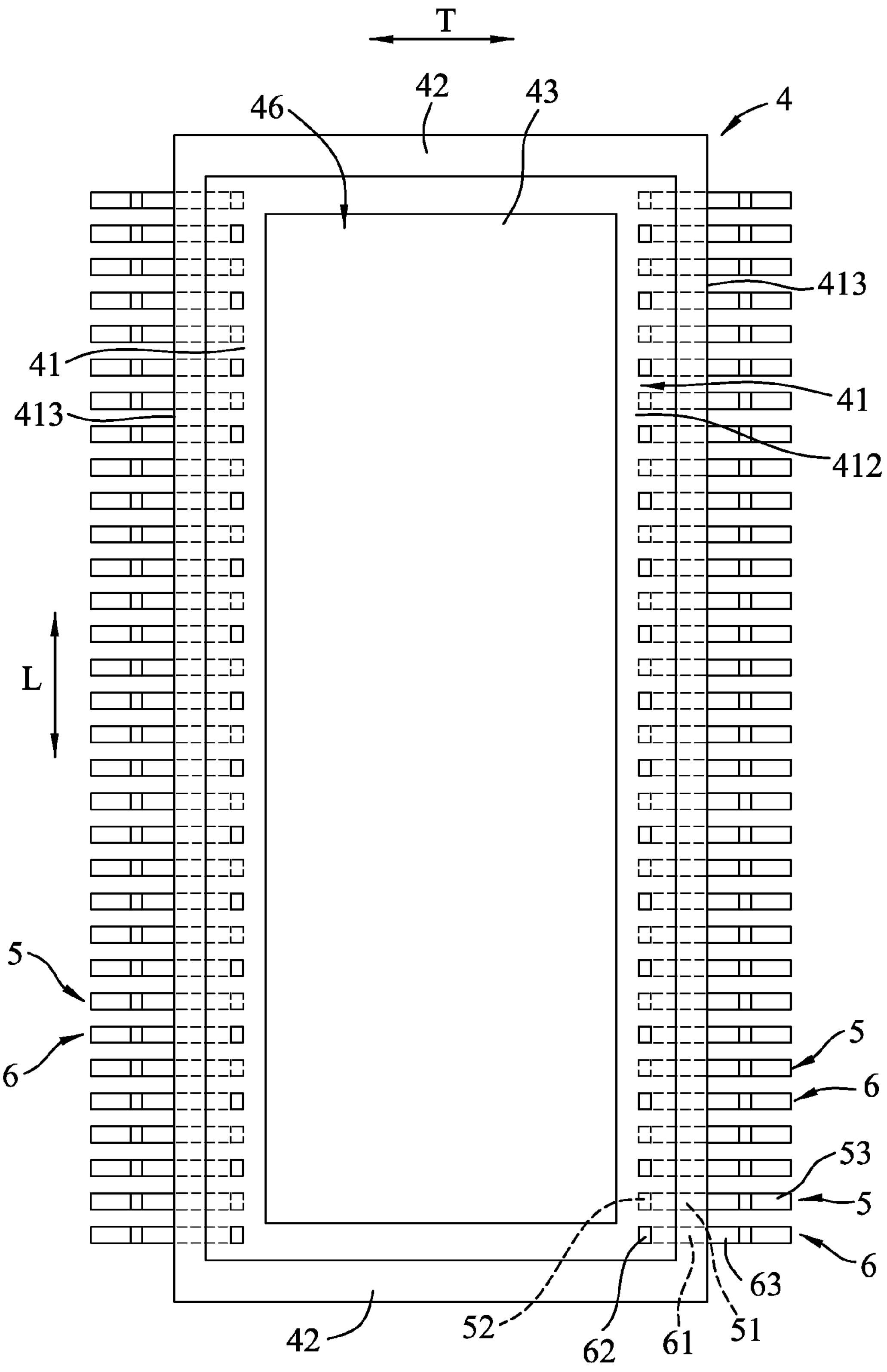
FIG. 4 is a schematic top view of the embodiment.

Referring to FIGS. 2 to 4, an embodiment of an electronic device package box is adapted to be electrically connected to a plurality of coil components 31 and electrically mounted to a circuit board 32.

The electronic device package box includes a box unit 4, and two pin rows each including a plurality of first connecting pins 5 and a plurality of second connecting pins 6 that are arranged with the first connecting pins 5 in one row.

The box unit 4 defines a lower space 45 and an upper space 46 that are opposite to each other in an up-down direction (U) and that respectively receive corresponding ones of the coil components 31 therein, and includes a separating wall 43, a lower end section 47 and an upper end section 48. The separating wall 43 separates the lower space 45 and the upper space 46 from each other. The lower end section 47 and the upper end section 48 are spaced apart from each other in the up-down direction (U).

The first connecting pins 5 are mounted to the box unit 4. Each of the first connecting pins 5 has a first embedded portion 51, a first wire-connecting portion 52 and a first extending portion 53.

The second connecting pins 6 are mounted to the box unit 4. Each of the second connecting pins 6 has a second embedded portion 61, a second wire-connecting portion 62 and a second extending portion 63.

The first connecting pins 5 and the second connecting pins 6 of each pin row are spaced apart from each other, and are aligned with each other and alternatingly arranged in a longitudinal direction (L) perpendicular to the up-down direction (U).

In each of the first connecting pins 5, the first embedded portion 51 is embedded in the box unit 4, the first wire-connecting portion 52 is connected to the first embedded portion 51 and extends from the lower end section 47 of the box unit 4 so as to connect with a corresponding one of the coil components 31 received in the lower space 45, and the first extending portion 53 is connected to the first embedded portion 51, extends from the box unit 4 and is proximate to the lower end section 47.

In each of the second connecting pins 6, the second embedded portion 61 is embedded in the box unit 4, the second wire-connecting portion 62 is connected to the second embedded portion 61 and extends from the upper end section 48 of the box unit 4 so as to connect with a corresponding one of the coil components 31 received in the upper space 46, and the second extending portion 63 is connected to the second embedded portion 61, extends from the box unit 4 and is proximate to the lower end section 47.

To be more specific, in this embodiment, the box unit 4 further two side walls 41, two end walls 42 and a cover wall 44. The side walls 41 are spaced apart from each other, and extend in the longitudinal direction (L). The end walls 42 are spaced apart from each other, and extends in a transverse direction (T) that is perpendicular to the longitudinal direction (L) and the up-down direction (U). The side walls 41 and the end walls 42 are interconnected by the separating wall 43. Each of the side walls 41 has a bottom surface 411 and a top surface 412 that are spaced apart from each other in the up-down direction (U), and an outer side surface 413 interconnecting the bottom surface 411 and the top surface 412. The cover wall 44 removably covers the upper space 46.

In this embodiment, the lower space 45 and the upper space 46 of the box unit 4 are respectively formed with a lower end opening 451 and an upper end opening 461, which is adapted for the corresponding ones of the coil components 31 to be inserted therethrough.

In this embodiment, the first connecting pins 5 of each pin row are mounted to a respectively one of the side walls 41. The first embedded portion 51 of each of the first connecting pins 5 of each pin row is embedded in the respective one of the side walls 41. The first wire-connecting portion 52 of each of the first connecting pins 5 of each pin row extends from the bottom surface 411 of the respective one of the side walls 41. The first extending portion 53 of each of the first connecting pins 5 of each of the groups extends outwardly from the outer side surface 413 of the respective one of the side walls 41.

In this embodiment, the second connecting pins 6 of each pin row are mounted to a respective one of the side walls 41. The second embedded portion 61 of each of the second connecting pins 6 of each pin row is embedded in the respective one of the side walls 41. The second wire-connecting portion 62 of each of the second connecting pins 6 of each pin row extends from the top surface 412 of the respective one of the side walls 41. The second extending portion 63 of each of the second connecting pins 6 of each pin row extends outwardly from the outer side surface 413 of the respective one of the side walls 41.

The first extending portion 53 of each of the first connecting pins 5 has a shape substantially identical to that of the second extending portion 63 of each of the second connecting pins 6 such that the electronic device package box can be steadily mounted to the circuit board 32.

Referring particularly to FIG. 4, in this embodiment, the first wire-connecting portions 52 and the second wire-connecting portions 62 of each pin row are aligned such that the thickness of a corresponding one of the side walls 41 that is measured in the transverse direction (T) may be reduced, thereby achieving miniaturization of the electronic device package box.

In manufacturing the electronic device package box of this disclosure, the side walls 41, the end walls 42 and the separating wall 43 are formed as one piece. During formation of the box unit 4, the first embedded portions 51 of the first connecting pins 5 and the second embedded portions 61 of the second connecting pins 6 are simultaneously embedded into the side walls 41. Then, each of the coil components is placed into a corresponding one of the lower space 45 and the upper space 46, and is electrically connected to a corresponding one of the first wire-connecting portions 52 of the first connecting pins 5 and the second wire-connecting portions 62 of the second connecting pins 6. Subsequently, the cover wall 44 covers the upper space 46. The electronic device package box may be mounted to the circuit board 32 by means of, for example, welding or bonding the first extending portions 53 of the first connecting pins 5 and the second extending portions 63 of the second connecting pins 6 to the circuit board 32.

It is worth mentioning that the upper end opening 451 of the upper space 46 and the lower end opening 451 of the lower space 45 not only allow the corresponding ones of the coil components 31 to be respectively inserted therethrough, but also facilitate a worker in manufacturing the electronic device package box. To be more specific, the worker is capable of viewing the coil components 31 received in the upper space 46 through the upper end opening 451 of the upper space 46, and can manually connect each of the coil components 31 received in the upper space 46 to the second wire-connecting portion 62 of the corresponding one of the second connecting pins 6. Afterwards, the box unit 4 is flipped upside-down such that each of the coil components 31 received in the lower space 45 is connected to the first wire-connecting portion 52 of the corresponding one of the first connecting pins 5 by the worker.

To sum up, with the first wire-connecting portions 52 and the second wire-connecting portions 62 of each pin row are aligned, the thickness of the corresponding side wall 41 measured in the transverse direction (T) is reduced, while providing sufficient spaces among the first wire-connecting portions 52 and the second wire-connecting portions 62 for wire connection. As a result, the overall size of the electronic device package box according to this disclosure is reduced and the electronic device package box may be used in electronic devices that require miniaturized components.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment (s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic device package box adapted to be electrically connected to a plurality of coil components, said electronic device package box comprising:

a box unit defining a lower space and an upper space that are opposite to each other in an up-down direction and that respectively receive corresponding ones of the coil components therein, and including a separating wall, a lower end section and an upper end section, said separating wall separating said lower space and said upper space from each other, said lower end section and said upper end section being spaced apart from each other in the up-down direction; and at least one pin row including a plurality of first connecting pins that are mounted to said box unit, each of said first connecting pins having a first embedded portion, a first wire-connecting portion and a first extending portion, and a plurality of second connecting pins that are mounted to said box unit, each of said second connecting pins having a second embedded portion, a second wire-connecting portion and a second extending portion, wherein said first connecting pins and said second connecting pins are spaced apart from each other, and are aligned with each other and alternatingly arranged in a longitudinal direction perpendicular to the up-down direction, wherein, in each of said first connecting pins, said first embedded portion is embedded in said box unit, said first wire-connecting portion is connected to said first embedded portion and extends from said lower end section of said box unit so as to connect with a corresponding one of the coil components received in said lower space, and said first extending portion is connected to said first embedded portion, extends from said box unit and is proximate to said lower end section, wherein, in each of said second connecting pins, said second embedded portion is embedded in said box unit, said second wire-connecting portion is connected to said second embedded portion and extends from said upper end section of said box unit so as to connect with a corresponding one of the coil components received in said upper space, and said second extending portion is connected to said second embedded portion, extends from said box unit and is proximate to said lower end section.

2. The electronic device package box as claimed in claim 1, wherein:

said box unit further includes two side walls that are spaced apart from each other, that extend in the longitudinal direction, and that are interconnected by said separating wall, each of said side walls having a bottom surface and a top surface that are spaced apart from each other in the up-down direction, and an outer side surface interconnecting said bottom surface and said top surface;

said electronic device package box comprises two of said pin rows that are respectively mounted to said side walls;

said first embedded portion of each of said first connecting pins of each of said pin rows is embedded in said respective one of said side walls, said first wire-connecting portion of each of said first connecting pins of each of said pin rows extending from said bottom surface of said respective one of said side walls, said first extending portion of each of said first connecting pins of each of said pin rows extending outwardly from said outer side surface of said respective one of said side walls; and said second embedded portion of each of said second connecting pins of each of said pin rows is embedded in said respective one of said side walls, said second wire-connecting portion of each of said second connecting pins of each of said pin rows extending from said top surface of said respective one of said side walls, said second extending portion of each of said second connecting pins of each of said pin rows extending outwardly from said outer side surface of said respective one of said side walls.

3. The electronic device package box as claimed in claim 1, wherein said lower space and said upper space of said box unit are respectively formed with a lower end opening and an upper end opening, which are respectively adapted for the corresponding ones of the coil components to be inserted therethrough.

* * * * *